US012702012B2

(12) United States Patent　　　　(10) Patent No.:　US 12,702,012 B2

Hwang　　　　　　　　　　　　　　　(45) Date of Patent:　　　　Aug. 4, 2026

(54) DISPLAY DEVICE

(71) Applicant: LG Display Co., Ltd., Seoul (KR)

(72) Inventor: Jihyeon Hwang, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 655 days.

(21) Appl. No.: 18/192,221

(22) Filed: Mar. 29, 2023

(65) Prior Publication Data

US 2023/0245938 A1　　　Aug. 3, 2023

Related U.S. Application Data

(63) Continuation of application No. 17/243,292, filed on Apr. 28, 2021, now Pat. No. 11,640,927.

(30) Foreign Application Priority Data

Oct. 6, 2020　(KR) ........................ 10-2020-0128938

(51) Int. Cl.
*H10W 42/60*　　　(2026.01)
*H10K 59/80*　　　(2023.01)
(Continued)

(52) U.S. Cl.
CPC .......... *H10W 42/60* (2026.01); *H10W 74/114* (2026.01); *H10W 74/121* (2026.01);
(Continued)

(58) Field of Classification Search
None
See application file for complete search history.

(56) References Cited

U.S. PATENT DOCUMENTS 11,503,749　B2　11/2022　Sim et al.
2018/0088380　A1*　3/2018　Oka ................... G02F 1/136286
(Continued)

FOREIGN PATENT DOCUMENTS

KR　10-2004-0100077　A　12/2004
KR　10-2007-0098184　A　10/2007
(Continued)

OTHER PUBLICATIONS

Korean Intellectual Property Office, Office Action, Korean Patent Application No. 10-2020-0128938, Aug. 9, 2024, 16 pages.

*Primary Examiner* — Sue A Purvis
*Assistant Examiner* — Jordan M Klein
(74) *Attorney, Agent, or Firm* — Fenwick & West LLP

(57)　　　　　　　ABSTRACT

The present disclosure relates to display devices, and more specifically, a display device including a display panel including an active area and a non-active area surrounding the active area and including a pad area, a driving integrated circuit disposed in the pad area, a stiffener disposed between the driving integrated circuit and the active area, spaced apart from the driving integrated circuit, and disposed to surround a portion of a lateral surface of the driving integrated circuit, and a color-changing layer having a color, disposed to surround a portion, or all, of the lateral surface of the driving integrated circuit, and overlapping with at least a portion of an upper surface of the stiffener. As the display device includes the color-changing layer, even without separate measurement equipment, quality and a process condition or situation of the display device can be easily checked or identified.

20 Claims, 8 Drawing Sheets

(51) Int. Cl.
$$
\begin{array}{ll}
\textbf{\textit{H10K 77/10}} & (2023.01) \\
\textbf{\textit{H10K 102/00}} & (2023.01) \\
\textbf{\textit{H10W 74/10}} & (2026.01) \\
\textbf{\textit{H10W 74/47}} & (2026.01) \\
\textbf{\textit{H10W 90/00}} & (2026.01) \\
\end{array}
$$

(52) U.S. Cl.
CPC ........ *H10W 90/00* (2026.01); *H10K 59/8794* (2023.02); *H10K 77/111* (2023.02); *H10K 2102/311* (2023.02); *H10W 74/473* (2026.01); *H10W 90/732* (2026.01)

(56)     References Cited

U.S. PATENT DOCUMENTS

| | | |
|---|---|---|
| 2019/0197281 A1 | 6/2019 | Choi et al. |
| 2019/0205603 A1 | 7/2019 | Lee et al. |
| 2020/0045826 A1 | 2/2020 | Wang et al. |
| 2021/0168973 A1 | 6/2021 | Sim et al. |

FOREIGN PATENT DOCUMENTS

| | | |
|---|---|---|
| KR | 10-0834262 B1 | 5/2008 |
| KR | 10-2019-0078835 A | 7/2019 |
| KR | 10-2019-0121469 A | 10/2019 |

* cited by examiner

A change in temperature
or
A change in a wavelength of light

170 — -10℃~20℃   0℃~10℃   10℃~20℃   20℃~30℃   30℃~40℃   40℃~50℃   50℃~60℃   More than 60℃

Tempreature

320nm~400nm	290nm~320nm	200nm~290nm

DISPLAY DEVICE

CROSS-REFERENCE TO RELATED APPLICATION

This application is a continuation of U.S. patent application Ser. No. 17/243,292 filed on Apr. 28, 2021 which claims the priority benefit of Republic of Korea Patent Application No. 10-2020-0128938, filed on Oct. 6, 2020 in the Korean Intellectual Property Office, each of which is incorporated herein by reference in its entirety.

BACKGROUND

Field of the Disclosure

The present disclosure relates to display devices, and more specifically, to a display device for implementing a narrow bezel and for protecting a driving integrated circuit.

Description of the Background

As the information-oriented society has been developed, various needs for display devices for displaying an image have increased. Recently, various types of display devices, such as a liquid crystal display (LCD) device, a plasma display panel (PDP) device, and an organic light emitting diode (OLED) display device, have been utilized.

In order to increase display areas of such display devices or to improve aesthetics thereon, research on reducing a width of a bezel area is in progress.

However, in actual, it is not easy to design a structure to reduce such a bezel area, and when designing a structure to reduce a size of the bezel area, a defect can be caused in which a driving circuit is damaged by an external force.

Further, there is a difficulty for securing a desired quality of associated configurations or elements for preventing the damage of driving circuits.

SUMMARY

A display device includes a display pane, and at least one driving circuit (e.g., a driving integrated circuit) may be located in a pad area of the display panel. Such a driving circuit may be damaged by foreign substances or crack due to external force.

Further, in the case of the driving circuit bonded to the display panel, there is a high probability that bonding defects, such as being lifted from the display panel or being torn, can occur.

There is a substantial difficulty for securing a desired quality of associated configurations or elements for preventing the damage of driving circuits.

Further, in a situation where a printed circuit is bonded to the display panel, a pad portion of the display panel can be inevitably increased. Therefore, there is a problem that a size of a corresponding bezel area is increased.

To address such issues, a display device is disclosed with a new surface and a method for manufacturing for configuring the display device with the new surface that is capable of protecting a driving circuit disposed in a display panel while reducing a size of the bezel area and a thickness of the display device, and reducing the occurrence of a malfunction of the display device due to static electricity.

In accordance with embodiments of the present disclosure, a display device is provided that is capable of reducing a thickness of a non-active area of the display device while reducing a size of a bezel area.

In accordance with embodiments of the present disclosure, a display device is provided that is capable of protecting a driving circuit from foreign substances or external force.

In accordance with embodiments of the present disclosure, a display device is provided that is capable of easily securing a desired quality of associated configurations or elements for preventing the damage of driving circuits.

Problems or drawbacks to be solved of the present disclosure are not limited to the above description, and other problems or drawbacks to be solved of the present disclosure will become apparent to those skilled in the art from the following description.

In accordance with one aspect of the present disclosure, a display device is provided that includes a display panel including an active area, and a non-active area surrounding the active area and including a pad area, and at least one driving integrated circuit is disposed in the pad area. The display device includes a stiffener disposed between the driving integrated circuit and the active area, spaced apart from the driving integrated circuit, and disposed to surround a portion of a lateral surface of the driving integrated circuit, and a color-changing layer disposed to surround at least a portion, or all, of the lateral surface of the driving integrated circuit, and overlapping with a portion of an upper surface of the stiffener.

In accordance with one aspect of the present disclosure, a display device is provided that includes a display panel including an active area, and a non-active area surrounding the active area and including a pad area. At least one driving integrated circuit is disposed in the pad area of the display panel. Further, the display panel includes a stiffener disposed in the display panel, and disposed between the driving integrated circuit and the active area, a flexible printed circuit disposed in an edge of the display panel in the non-active area, and spaced apart from the driving integrated circuit, a color-changing layer having a color, disposed to surround the driving integrated circuit, and disposed on a portion of an upper surface of the stiffener and a portion of an upper surface of the flexible printed circuit, and an antistatic member disposed on the driving integrated circuit and the color-changing layer. Here, the color-changing layer includes at least one of a first pigment whose color changes according to a change in temperature and a second pigment whose color changes according to a wavelength change of light.

In accordance with aspects of the present disclosure, as a driving integrated circuit is disposed in a display panel without a separate substrate, there are produced effects of reducing a size of a bezel area.

Further, in accordance with aspects of the present disclosure, as a stiffener is disposed to surround a portion of a lateral surface of the driving integrated circuit, even when external force is applied to the display panel, there are produced effects of preventing the driving integrated circuit from being detached from a lower substrate.

Further, in accordance with aspects of the present disclosure, as a process condition or situation of the color-changing layer can be checked through a color of the color-changing layer, even when a defect in the color-changing layer occurs, there are produced effects of allowing wrong process conditions to be quickly corrected.

Further, in accordance with aspects of the present disclosure, as the color-changing layer has a color, and thus, a location, a thickness, and the like of the color-changing layer can be checked with the eyes of the inspector, thus, even without separate measurement equipment, there are produced effects of allowing quality of the color-changing layer to be checked.

Further, in accordance with aspects of the present disclosure, as the color-changing layer is disposed to surround the entire lateral surface of the driving integrated circuit, there are produced effects of reducing the penetration of foreign substances to the driving integrated circuit.

Effects of the present disclosure are not limited to the above described effects, and other effects of the present disclosure will become apparent to those skilled in the art from the following description.

DETAILED DESCRIPTION

Figure 1:
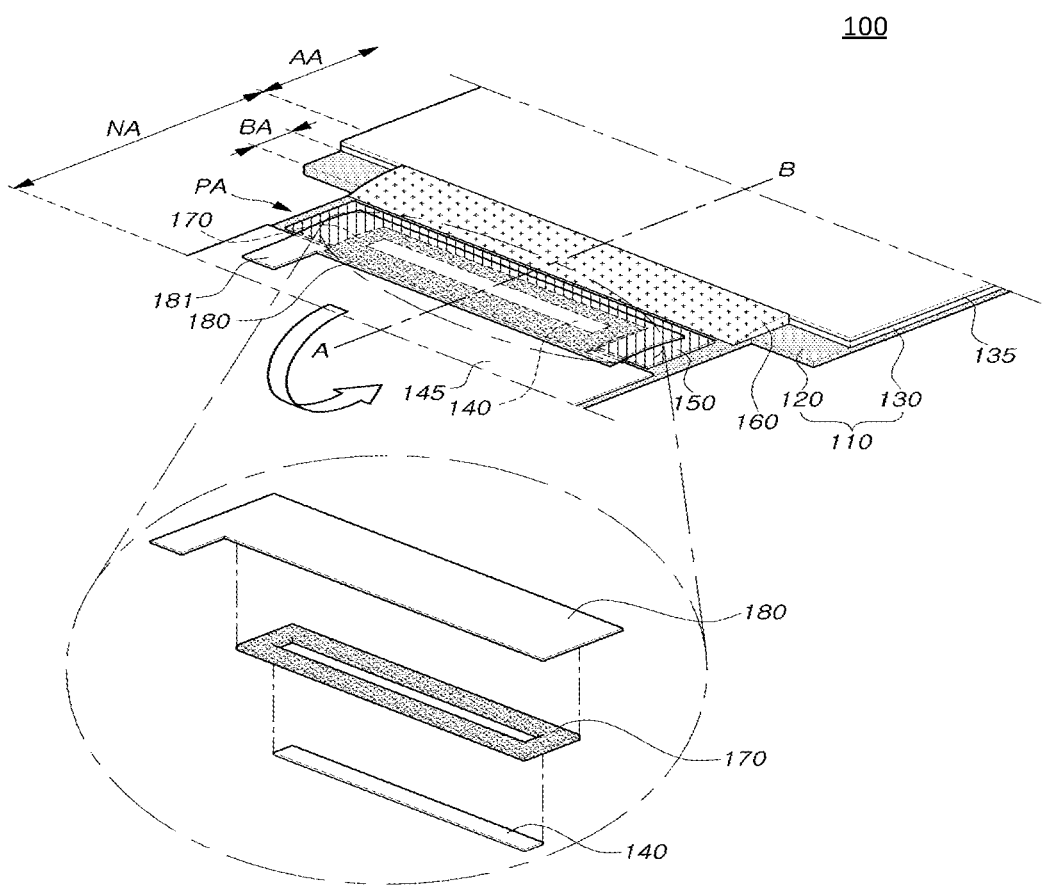
FIG. 1 schematically illustrates a display device according to aspects of the present disclosure.

The advantages and features of the present disclosure and methods of achieving the same will be apparent by referring to embodiments of the present disclosure as described below in detail in conjunction with the accompanying drawings. However, the present disclosure is not limited to the embodiments set forth below, but may be implemented in various different forms. The following embodiments are provided only to completely disclose the present disclosure and inform those skilled in the art of the scope of the present disclosure, and the present disclosure is defined only by the scope of the appended claims.

In addition, the shapes, sizes, ratios, angles, numbers, and the like illustrated in the accompanying drawings for describing the exemplary embodiments of the present disclosure are merely examples, and the present disclosure is not limited thereto. Like reference numerals generally denote like elements throughout the present specification. Further, in the following description of the present disclosure, detailed description of well-known functions and configurations incorporated herein will be omitted when it is determined that the description may make the subject matter in some embodiments of the present disclosure rather unclear. The terms such as "including", "having", "containing", and "comprising of" used herein are generally intended to allow other components to be added unless the terms are used with the term "only". Singular forms used herein are intended to include plural forms unless the context clearly indicates otherwise.

In interpreting any elements or features of the embodiments of the present disclosure, it should be considered that any dimensions and relative sizes of layers, areas and regions include a tolerance or error range even when a specific description is not conducted.

Spatially relative terms, such as, "on", "over", "above", "below", "under", "beneath", "lower", "upper", "near", "close", "adjacent", and the like, may be used herein to describe one element or feature's relationship to another element(s) or feature(s) as illustrated in the figures, and it should be interpreted that one or more elements may be further "interposed" between the elements unless the terms such as "directly", "only" are used.

Time relative terms, such as "after", "subsequent to", "next to", "before", or the like, used herein to describe a temporal relationship between events, operations, or the like are generally intended to include events, situations, cases, operations, or the like that do not occur consecutively unless the terms, such as "directly", "immediately", or the like, are used.

When the terms, such as "first", "second", or the like, are used herein to describe various elements or components, it should be considered that these elements or components are not limited thereto. These terms are merely used herein for distinguishing an element from other elements. Therefore, a first element mentioned below may be a second element in a technical concept of the present disclosure.

The elements or features of various exemplary embodiments of the present disclosure can be partially or entirely bonded to or combined with each other and can be interlocked and operated in technically various ways as can be fully understood by a person having ordinary skill in the art, and the various exemplary embodiments can be carried out independently of or in association with each other.

Hereinafter, discussions will be conducted on various features or configurations of a display device according to embodiments of the present disclosure, with reference with the accompanying drawings.

A display device according to aspects of the present disclosure includes a display panel including an active area, and a non-active area surrounding the active area and including a pad area. At least one driving integrated circuit is disposed in the pad area. The display device includes a stiffener disposed between the driving integrated circuit and the active area, spaced apart from the driving integrated circuit, and disposed to surround a portion of a lateral surface of the driving integrated circuit, and a color-changing layer disposed to surround a portion, or all, of the lateral surface of the driving integrated circuit, and overlapping with a portion of an upper surface of the stiffener.

Further, the color-changing layer of the display device may include a matrix curing according to a change in temperature applied to a material included in the color-changing layer, and a pigment whose color changes according to a change in temperature.

The color-changing layer may include two types of pigments whose colors change in respective temperature ranges different from each other.

Here, the pigments may not return to their original respective colors after such original colors are changed according to a change in temperature or a change in a wavelength of light.

Further, a display device according to aspects of the present disclosure may include a flexible printed circuit disposed in a portion of a pad area of a display panel, for example, one side, or an edge, of the pad panel, and spaced apart from the driving integrated circuit.

A portion of the color-changing layer may extend from a region corresponding to a lateral surface of a driving integrated circuit up to a portion of an upper surface of the flexible printed circuit.

Such a color-changing layer may be disposed to expose all or at least a portion of an upper surface of the driving integrated circuit.

An antistatic member for reducing static electricity may be disposed on the upper surface of the driving integrated circuit.

The antistatic member may be disposed on the color-changing layer, and disposed on at least a portion of an upper surface of the flexible printed circuit.

The antistatic member may be electrically connected to ground disposed in the flexible printed circuit.

Further, a display device according to aspects of the present disclosure may include a bending area located in a non-active area of a display panel, and a coating layer disposed in the bending area.

The coating layer may be disposed to be spaced apart the stiffener.

Further, a display device according to aspects of the present disclosure may include a bonding layer disposed between the driving integrated circuit and the display panel.

The bonding layer may contact all, or at least a portion, of the lateral surface of the driving integrated circuit.

Further, a display device according to aspects of the present disclosure includes a display panel including an active area, and a non-active area surrounding the active area including a pad area. At least one driving integrated circuit is disposed in the pad area of the display panel. Further, the display panel includes a stiffener disposed in the display panel, and disposed between a driving integrated circuit and the active area, a flexible printed circuit disposed in an edge of the display panel in the non-active area, and spaced apart from the driving integrated circuit, a color-changing layer having a color, disposed to surround the driving integrated circuit, and disposed on a portion of an upper surface of the stiffener and a portion of an upper surface of the flexible printed circuit, and an antistatic member disposed on the driving integrated circuit and the color-changing layer. Here, the color-changing layer includes at least one of a pigment whose color changes according to a change in temperature and a pigment whose color changes according to a wavelength change of light.

A display device according to aspects of the present disclosure may include a liquid crystal module LCM including a display panel and one or more drivers for driving the display panel, an organic light emitting diode (OLED) module, a quantum dot module, or the like. Further, the display device according to aspects of the present disclosure may include equipment displays including notebook computers, televisions, computer monitors, automotive displays, other forms of vehicles etc. that are complete products or final products including the LCM, the OLED module, the QD module etc., set electronic devices such as mobile electronic devices etc., such as smartphones, electronic pads etc., or set devices (or set apparatuses)

Hereinafter, with reference to the accompanying drawings, various embodiments of the present disclosure will be described in detail.

Figure 2:
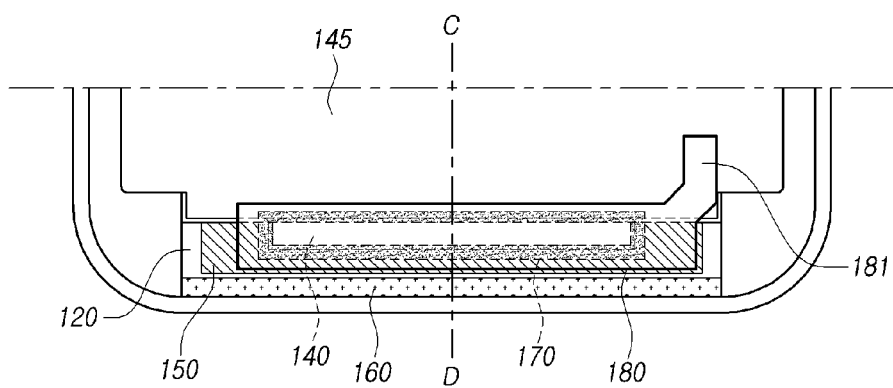
FIG. 2 schematically illustrates a region of a display panel in which a driving transistor is disposed in a state where a portion of the display panel is bent according to aspects of the present disclosure.

FIG. 1 schematically illustrates a display device according to aspects of the present disclosure. FIG. 2 schematically illustrates a region of a display panel in which a driving transistor is disposed in a status where a portion of the display panel is bent according to aspects of the present disclosure.

Referring to FIG. 1, the display device 100 includes a display panel 110, a driving integrated circuit 140, and a flexible printed circuit 145.

The display panel 110 may include a lower substrate 120 and an upper substrate 130.

Various types of display panels, such as, a liquid crystal display panel, an organic light emitting display panel, a quantum dot display panel, an electroluminescent display panel, and the like may be used as display panels 110 according to embodiments herein.

For example, in a situation where the organic light emitting display panel is employed as the display panel, such display panel may include a plurality of gate lines and a plurality of data lines, and pixels disposed in regions in which each gate line and each data line intersect each other. Further, the display panel may include an array of thin film transistors that are elements for selectively applying voltages to each pixel, organic light emitting diodes on or over the array of thin film transistors, an encapsulation substrate or an encapsulation layer disposed to cover the organic light emitting diodes, and the like.

Such a display panel 110 may include an active area AA in which images are displayed and a non-active area NA surrounding the active area AA.

The gate lines and the data lines are disposed in the active area AA of the display panel 110, and sub-pixels defined by the gate lines and the data lines are arranged in the active area AA.

The non-active area NA of the display panel 110 includes a pad area PA for the electrical connection of at least one driving integrated circuit 140 and a flexible printed circuit 145.

At least one driving integrated circuit 140 may be disposed in the pad area PA of the display panel 110.

As shown in FIG. 1, the pad area PA of the display panel 110 may be disposed in at least one portion of the lower substrate 120, such a bottom edge, a lateral edge, or the like. Further, the driving integrated circuit 140 may be disposed in the pad area PA located in the lower substrate 120 of the display panel 110.

The driving integrated circuit 140 may include a data driving circuit for driving data lines. The driving integrated circuit 140 may further include a gate driving circuit for driving gate lines. The driving integrated circuit 140 may further include a timing controller for controlling the data driving circuit and the gate driving circuit.

Meanwhile, in a situation where the display device 100 is a touch-sensible device, the display device 100 may further include a touchscreen panel in which touch sensors are disposed.

The touchscreen panel may be an external type in which the touchscreen panel is present outside of the display panel 110, or an embedded type in which the touchscreen panel is present inside of the display panel 110.

Thus, when the display device 100 is a touch-sensible device, the driving integrated circuit 140 may further include a touch sensing circuit for sensing a touch input.

A plurality of pads may be disposed in the pad area PA of the display panel 110 according to embodiment herein, and at least one driving integrated circuit 140 may be disposed on or over one or more of the pads.

A bonding layer may be disposed between the plurality of pads and the driving integrated circuit 140. The driving integrated circuit 140 may be bonded to the lower substrate 120 through the bonding layer, and at the same time, the driving integrated circuit 140 may be electrically connected to one or more pads located in the pad area PA. In other words, the bonding layer can serve to bond the driving integrated circuit 140 to the lower substrate 120.

The bonding layer may be an anisotropic conductive film (ACF). However, embodiments of the present disclosure are not limited thereto. For example, the bonding layer may include a matrix that is formed of a resin, and conductive balls in the matrix.

For example, the bonding layer disposed between the driving integrated circuit 140 and the lower substrate 120 may be a film type, for example, an anisotropic conductive film (ACF), or the like.

Although not shown in drawings, link lines formed by the extending of signal lines, such as data lines and gate lines or touch lines (signal lines connected to touch sensors), arranged in the display area AA may be disposed in the pad area PA of the display panel 110.

The driving integrated circuit 140 may be electrically connected to pads that are connected to link lines disposed in the pad area PA of the display panel 110.

The flexible printed circuit 145 according to embodiments herein may be disposed in the pad area PA of the display panel 110. Here, the flexible printed circuit 145 may be disposed to be spaced apart from the driving integrated circuit 140, or be electrically connected to the driving integrated circuit 140 through signal lines disposed in the pad area PA.

As described above, the display panel 110 according to embodiments herein has a structure in which the driving integrated circuit 140 is disposed on or over the lower substrate 120 of the display panel 110, other than a structure in which a substrate or a film on which the driving integrated circuit 140 is mounted is electrically connected on or over the lower substrate 120 of the display panel 110.

Accordingly, as a substrate or a film on which the driving integrated circuit 140 is mounted is not employed, there are produced effects of reducing a width of the non-display area NA (or a bezel width.

The display device 100 according to embodiments herein may include a bending area located in the non-active area NA. In the bending area, a coating layer 160 may be disposed on the lower substrate 120 of the display panel 110.

The coating layer 160 may be formed of an organic material. When the lower substrate 120 is bent, the coating layer 160 can cause several types of lines disposed in the bending area BA to be located to be closer to a neutral plane; as a result, serve to reduce tensile stress and shrinkage stress that may be received by such lines. Further, the coating layer 160 can serve to prevent such several types of lines from being exposed to moisture and oxygen. Here, the several types of lines may be lines connected to the lines (or signal lines) disposed in the pad area PA.

The display panel 110 of the display device 100 may be bent in a bending direction in the bending area BA. Here, the bending of the display panel 110 in a bending direction may mean that a region in which the coating layer 160 is disposed on the lower substrate 120 of the display panel 110 is bent or folded toward a rear surface of the lower substrate 120, When the display panel 110 according to embodiments herein is bent in the bending area BA, as shown in FIG. 2, the driving integrated circuit 140 may be disposed to correspond to the rear surface of the lower substrate 120.

When an organic light emitting display panel is used as the display panel 110, the lifetime of an organic light emitting element disposed in the display panel 110 may be reduced due to heat generated from the driving integrated circuit 140, and as a result, defects of the display panel may be caused. For example, a stain on the panel may be visible due to deterioration of the organic light emitting element.

In contrast, as in the display device 100 according to embodiments herein, when the display panel 110 is bent in the bending area BA, as the driving integrated circuit 140 is located to correspond to the rear surface of the lower substrate 120, a distance between the driving integrated circuit 140 and a corresponding organic light emitting element may be increased; thus, it is possible to prevent the occurrence of a phenomenon in which the lifetime of the organic light emitting element is shortened.

Further, as illustrated in FIGS. 1 and 2, a stiffener 150 may be disposed on or over one surface of the lower substrate 120 of the display panel 110.

The stiffener 150 may be disposed in the non-active area NA of the display device 100, and disposed between the driving integrated circuit 140 disposed in the non-active area NA and the active area AA of the display device 100.

In one embodiment, the stiffener 150 may be disposed between the driving integrated circuit 140 and the polarizing plate 135.

Although FIG. 1 illustrates a structure in which the polarizing plate 135 is disposed on or over the upper substrate 130 of the display panel 110. However, embodiments of the present disclosure are not limited thereto. For example, the polarizing plate 135 may be disposed on the rear surface of the lower substrate 120 of the display panel 110, or in some embodiments, the polarizing plate may not be disposed in an upper portion and a lower portion of the display panel 110.

Accordingly, the stiffener 150 may produce an effect of preventing or reducing the likelihood of the driving integrated circuit 140 from being detached without adversely affecting, such as covering the active area AA. The stiffener 150 may be a plate or tape including at least one type of metal. However, embodiments of the present disclosure are not limited thereto.

For example, the stiffener 150 may be formed of stainless steel, however, embodiments of the present disclosure are not limited thereto.

The stiffener 150 is disposed on one surface of the lower substrate 120 on which the driving integrated circuit 140 is disposed. Further, the stiffener 150 may be spaced apart from the driving integrated circuit 140, and may be disposed to surround a portion of a lateral surface of the driving integrated circuit 140. The stiffener 150 may be disposed at a location corresponding to the portion of the lateral surface of the driving integrated circuit 140 while not contacting the driving integrated circuit 140.

Meanwhile, FIGS. 1 and 2 illustrates that the driving integrated circuit 140 has a rectangular shape in plan view. However, a shape of the driving integrated circuit 140 according to embodiments herein is not limited thereto. For example, the driving integrated circuit 140 may have various shapes such as a polygonal shape, a linear shape, a circular shape, an elliptical shape, or the like in plan view.

Herein, for convenience of discussions, it is assumed that the driving integrated circuit 140 in plan view has a rectangular structure.

As shown in FIGS. 1 and 2, the stiffener 150 may be disposed to surround three lateral surfaces of the driving integrated circuit 140. In this instance, the stiffener 150 may be disposed to surround the other lateral surfaces except for a lateral surface of the driving integrated circuit 140 disposed in a direction facing the flexible printed circuit 145.

A structure of the stiffener 150 according to embodiments herein is not limited thereto. For example, the stiffener 350 may be disposed to surround at least one lateral surface of the driving integrated circuit 140. The stiffener 350 may not be disposed in a region corresponding to a lateral surface of the driving integrated circuit 140 facing the flexible printed circuit 145. However, embodiments of the present disclosure are not limited thereto.

As the stiffener 150 is disposed to surround a portion of at least one lateral surface of the driving integrated circuit 140, the driving integrated circuit 140 bonded on or over the lower substrate 120 can be prevented or reduce the likelihood from being detached from the lower substrate 120 by an external force.

In a situation where the driving integrated circuit 140 is directly attached to the lower substrate 120 through a bonding layer, there is a probability that an external force may be applied to the lower substrate 120 in the process of disposing another element (for example, an antistatic member 180) on or over the lower substrate 120. As a result, the lower substrate 120 may be deformed or bent, and the driving integrated circuit 140 may be detached from the lower substrate 120.

However, in the display device 100 according to embodiments herein, as the stiffener 150 is disposed to surround a portion of one or more lateral surfaces of the driving integrated circuit 140 on the lower substrate 120 of the display panel 110, even when an external force is applied to the display panel 110, the driving integrated circuit 140 can be prevented from being detached from the lower substrate 120 because the stiffener 150 can hold the deformation or bending of the lower substrate 120 of the display panel 110.

Further, as the stiffener 150 and the driving integrated circuit 140 are disposed to be spaced apart from each other, electrical and mechanical damage to the driving integrated circuit 140 can be reduced due to interference between the stiffener 150 and the driving integrated circuit 140.

Further, embodiments of the present specification may include a color-changing layer 170 surrounding a portion, or all, of one or more lateral surfaces of the driving integrated circuit 140.

The color-changing layer 170 according to embodiments herein may have a height for allowing the driving integrated circuit 140 to be fixed to the display panel 110 while surrounding all, or a portion, of one or more lateral surfaces of the driving integrated circuit 140. Here, the height (or maximum height) of the color-changing layer 170 may be a greatest length based on a direction in which a first conductive film 410 and the driving integrated circuit 140 are stacked, among regions disposed on the display panel 110.

Here, the color-changing layer 170 may contact a portion, or all, of one or more lateral surfaces of the driving integrated circuit 140. However, embodiments of the present disclosure are not limited thereto. For example, while the color-changing layer 170 is disposed to surround one or more lateral surfaces of the driving integrated circuit 140, an element such as another resin (for example, an adhesive resin) may be further disposed in at least a partial region between the color-changing layer 170 and the driving integrated circuit 140.

The color-changing layer 170 can prevent or reduce penetration of moisture in one or more lateral surfaces of the driving integrated circuit 140.

The color-changing layer 170 may be disposed in a region corresponding to a lateral surface of the driving integrated circuit 140, and extend to be disposed in a portion of an upper surface of the stiffener 150. A portion of the color-changing layer 170 may also be disposed in a region between the driving integrated circuit 140 and the stiffener 150 in the non-active area NA.

Further, the color-changing layer 170 may be disposed in a region corresponding to a lateral surface of the driving integrated circuit 140, and extend to be disposed in a portion of an upper surface of the flexible printed circuit 145. A portion of the color-changing layer 170 may also be disposed in a region between the driving integrated circuit 140 and the flexible printed circuit 145 in the non-active area NA.

The color-changing layer 170 may be disposed to expose all or at least a portion of an upper surface of the driving integrated circuit 140.

An antistatic member 180 may be disposed on the upper surface of the driving integrated circuit 140. The antistatic member 180 may be attached to the upper surface of the driving integrated circuit 140 by including a bonding member.

The antistatic member 180 disposed on the driving integrated circuit 140 may be attached to a portion of the upper surface of the stiffener 150 and the upper surface of the color change layer 170.

In a plan view, an area of the antistatic member 180 may be larger than an area of each of the driving integrated circuit 140 and the color-changing layer 170. Accordingly, the antistatic member 180 may cover the upper surfaces of the driving integrated circuit 140 and the color-changing layer 170 and may overlap with a portion of the upper surfaces of the stiffener 150.

The antistatic member 180 can serve to discharge static electricity generated in the driving integrated circuit 140.

Further, as the antistatic member 180 has a structure that is bonded to a portion of the upper surface of the stiffener 150, thereby heat generated from the driving integrated circuit 140 can be transferred to the stiffener 150, and thus, the driving integrated circuit 140 can prevented from being damaged due to the heat.

Specifically, when the display panel 110 is driven, the antistatic member 180 can serve to enable some of heat generated from the driving integrated circuit 140 to be conducted to one or more other elements (for example, the stiffener 150), and enable the remaining heat to be discharged to the outside.

Further, as the antistatic member 180 is also attached to the upper surfaces of the driving integrated circuit 140 and the color-changing layer 170, the aesthetics on associated elements may be improved.

Further, referring to FIG. 1, the antistatic member 180 may include at least one extension part 181 formed on one side thereof.

For example, the antistatic member 180 may include an extension part 181 formed on one side of the antistatic member 180. The extension part 181 may form a single body with the antistatic member 180. However, embodiments of the present disclosure are not limited thereto. For example, the extension part 181 may be an element separated from the antistatic member 180.

The extension part 181 may be disposed on the flexible printed circuit 145.

The antistatic member 180 may be connected to the driving integrated circuit 140 by being attached to the upper surface of the driving integrated circuit 140, and also be connected to the flexible printed circuit 145 through the extension part 181.

The antistatic member 180 may be electrically connected with ground disposed in the flexible printed circuit 145.

Through this, it is possible to protect the driving integrated circuit 140 from static electricity.

Figure 3:
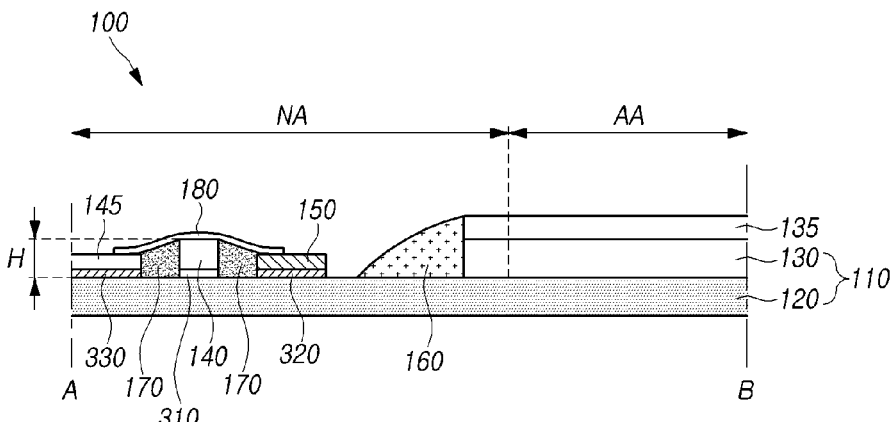
FIG. 3 is a cross-sectional view taken along with line A-B of FIG. 1 according to one embodiment.
Figure 4:
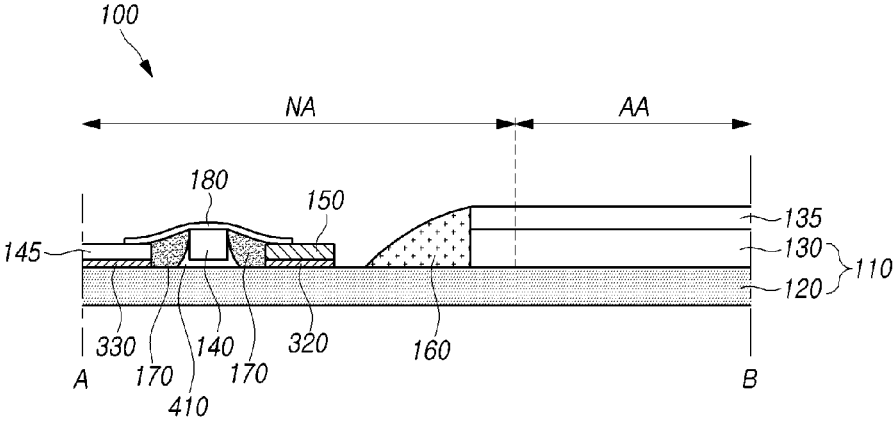
FIG. 4 illustrates another embodiment of a bonding layer in a display device according to aspects of the present disclosure.

FIG. 3 is a cross-sectional view taken along with line A-B of FIG. 1 according to one embodiment. FIG. 4 illustrates another embodiment of a bonding layer in a display device according to aspects of the present disclosure.

Hereinafter, in describing embodiments of the present disclosure, for convenience of description, descriptions of elements or configurations equal or corresponding to the embodiments described above will not be repeatedly performed. Display devices according to embodiments herein will be described with reference to drawings.

Referring to FIGS. 3 and 4, a display device 100 includes a display panel 110 including a lower substrate 120 and an upper substrate 130, a polarizing plate 135 disposed on the display panel 110, and a driving integrated circuit 140 disposed in the non-active area NA of the panel 110, a flexible printed circuit 145, a stiffener 150, a coating layer 160, a color-changing layer 170, and an antistatic member 180.

In the display device 100 according to embodiments herein with reference to FIGS. 3 and 4, the display panel 110 including the lower substrate 120 and the upper substrate 130, the polarizing plate 135 disposed on the display panel 110, the driving integrated circuit 140 disposed in the non-active area NA of the display panel 110, the flexible printed circuit 145, the stiffener 150, the coating layer 160, the color-changing layer 170, and the antistatic member 180 may be equal to the display panel 110 including the lower substrate 120 and the upper substrate 130, the polarizing plate 135 disposed on the display panel 110, the driving integrated circuit 140 disposed in the non-active area NA of the display panel 110, the flexible printed circuit 145, the stiffener 150, the coating layer 160, the color-changing layer 170, and the antistatic member 180, which are described with reference to FIGS. 1 and 2, respectively.

Referring to FIG. 3, the driving integrated circuit 140 is disposed on the lower substrate 120 of the display panel 110 in the non-active area NA, and a first bonding layer 310 may be disposed between the driving integrated circuit 140 and the lower substrate 120.

The first bonding layer 310 is disposed in a region between the lower substrate 120 and the driving integrated circuit 140, and serves to bond the driving integrated circuit 140 to the lower substrate 120 of the display panel 110.

The first bonding layer 310 may electrically connect between a plurality of pads located in a pad area of the display panel 110 and a plurality of pads of the driving integrated circuit 140. To do this, the first bonding layer 310 may include an adhesive resin (or resin) and a conductive material (e.g., conductive particles).

The stiffener 150 may be disposed between the driving integrated circuit 140 and the active area AA in the non-active area of the display panel 110. The stiffener 150 may be attached to the lower substrate 120 of the display panel 110 through a second bonding layer 320.

The coating layer 160 may be disposed on the lower substrate 120 in the non-active area NA, and may be disposed to be spaced apart from the stiffener 150.

When the coating layer 160 is disposed on the upper surface of the stiffener 150, a step may occur on an upper surface of the stiffener 150 due to a material of the coating layer 160. However, when a step is placed on the upper surface of the stiffener 160, there is a probability that a defect occurs in an outer edge of the antistatic member 180 disposed on a portion of the upper surface of the stiffener 150 may occur.

In the display device according to embodiments herein, as the coating layer 160 and the stiffener 150 are spaced apart from each other, there are produced effects of preventing the occurrence of appearance defects of the antistatic member 180 due to a step difference caused by the coating layer 160.

Further, a color-changing layer 170 may be disposed on the display panel 110.

The color-changing layer 170 may be disposed to surround all, or a portion, of one or more lateral surfaces of the driving integrated circuit 140. Further, the color-changing layer 170 may be disposed to surround all of one or more lateral surfaces of the first bonding layer 310 disposed beneath the driving integrated circuit 140. The color-changing layer 170 may contact all, or a portion, of one or more lateral surfaces of the driving integrated circuit 140, and contact all of one or more lateral surfaces of the first bonding layer 310.

As the color-changing layer 170 has a structure surrounding all, or a portion, of one or more lateral surfaces of the driving integrated circuit 140, even when an external force is applied to the display device 100, the color-changing layer 170 can serve to prevent or reduce deformation of the driving integrated circuit 140 or from being detached from the display panel 110.

In other words, the color-changing layer 170 may serve to fix the driving integrated circuit 140 to the display panel 110 together with the stiffener 150. Further, the color-changing layer 170 may prevent or reduce penetration of moisture into one or more lateral surfaces of the driving integrated circuit 140.

The color-changing layer 170 may be disposed in a region corresponding to a portion of one or more lateral surfaces of the driving integrated circuit 140, and extend to be disposed in a portion of an upper surface of the stiffener 150. A portion of the color-changing layer 170 may also be disposed in a region between the driving integrated circuit 140 and the stiffener 150 in the non-active area NA.

Further, the color-changing layer 170 may be disposed in a region corresponding to a portion of one or more lateral surfaces of the driving integrated circuit 140, and extend to be disposed in a portion of an upper surface of the flexible printed circuit 145. A portion of the color-changing layer 170 may also be disposed in a region between the driving integrated circuit 140 and the flexible printed circuit 140 in the non-active area NA.

Further, the color-changing layer 170 may be disposed to expose the upper surface of the driving integrated circuit 140. In other words, the color-changing layer 10 may not overlap with at least a portion of the upper surface of the driving integrated circuit 140.

The flexible printed circuit 145 may be disposed in an outer edge of the lower substrate 120 in the non-active area NA. The flexible printed circuit 145 may be bonded to the lower substrate 120 through a third bonding layer 330. The third bonding layer 33 may serve to electrically connect between the flexible printed circuit 145 and at least one pad disposed on the lower substrate 120. To do this, the third bonding layer 330 may include an adhesive resin (or resin) and a conductive material (e.g., conductive particles).

The color-changing layer 170 may be disposed in a region corresponding to one or more lateral surfaces of the driving integrated circuit 140, and extend to be disposed in a portion of the upper surface of the stiffener 150. Further, the color-changing layer 170 may be disposed to contact a region corresponding to one or more lateral surfaces of the driving integrated circuit 140, and extend to contact a portion of the upper surface of the flexible printed circuit 145.

A maximum height H of the color-changing layer 170 may be 0.17 mm or less. However, as this is merely an example value, embodiments of the present disclosure are not limited thereto. For example, a maximum height H of the color-changing layer 170 according to the embodiments herein may be in a range from half the sum of a height of the first bonding layer 310 and a height of the driving integrated circuit 140 to the sum of the height of the first bonding layer 310 and the height of the driving integrated circuit 140.

Here, the maximum height of the color-changing layer 70 may be a greatest length based on a direction in which a first conductive film 410 and the driving integrated circuit 140 are stacked, among regions disposed on the display panel 110.

A location and a height of the color-changing layer 170 may be determined according to an amount of a material included the color-changing layer 170.

However, in the process of forming the color-changing layer 170, when a large amount of material of the color-changing layer 170 is applied, the material of the color-changing layer 170 may cover up to at least a portion of the upper surface of the driving integrated circuit 140. In this situation, the color-changing layer 170 may act as an element that interferes with the connection between the driving integrated circuit 140 and the antistatic member 180, or the driving integrated circuit 140 may be damaged due to a step difference caused by the material of the color-changing layer 170 when the antistatic member 180 is connected.

Further, in the process of forming the color-changing layer 170, when a small amount of the material of the color change layer 170 is applied, the color change layer 170 may be formed to expose the most of one or more lateral surfaces of the driving integrated circuit 140. In this situation, since the driving integrated circuit 140 cannot be properly fixed, the driving integrated circuit 140 may be removed from the lower substrate 120 or foreign substances may penetrate the driving integrated circuit 140.

Therefore, the material of the color-changing layer 170 is needed to be disposed so that the color-changing layer 170 can be disposed to correspond to all, or a portion, of one or more lateral surfaces of the driving integrated circuit 140. Further, when the material of the color-changing layer 170 is disposed on the lateral surface 120 with an appropriate amount, a portion of the color-changing layer 170 may cover a portion of the upper surface of the stiffener 150, and another portion of the color-changing layer 170 may cover a portion of the upper surface of the flexible printed circuit 145.

In this manner, as the color-changing layer 170 is disposed to correspond to all, or a portion, of one or more lateral surfaces of the driving integrated circuit 140, and at the same time, extends to a portion of the upper surface of the flexible printed circuit 145, while fixing the driving integrated circuit 140 to the lower substrate 120, the color-changing layer 170 can produce an effect of preventing unnecessary movement of the flexible printed circuit 145 or detachment from the lower substrate 120.

FIG. 3 illustrates a structure in which the first bonding layer 310 is disposed only beneath the driving integrated circuit 140. However, however, the display device according to embodiments herein is not limited thereto.

For example, as shown in FIG. 4, the first bonding layer 410 may be disposed on the rear surface of the driving integrated circuit 140 and extend to be disposed in a region corresponding to all, or a portion, of one or more lateral surfaces of the driving integrated circuit 140. In this situation, the first bonding layer 410 may contact all, or a portion, of one or more lateral surfaces of the driving integrated circuit 140.

A thickness of the first bonding layer 410 disposed in a region corresponding to one or more lateral surfaces of the driving integrated circuit 140 may decrease as a distance from the lower substrate 120 increases. Here, the thickness of the first bonding layer 410 may be a length between the top and rear surfaces of the first bonding layer 410 based on a direction perpendicular to a direction in which the first bonding layer 410 and the driving integrated circuit 140 are stacked.

As shown in FIG. 4, the first bonding layer 410 may be disposed between the driving integrated circuit 140 and the color-changing layer 170 in one or more regions corresponding to one or more lateral surfaces of the driving integrated circuit 140. The first bonding layer 410 and the color-changing layer 170 can prevent or reduce penetration of moisture into one or more lateral surfaces of the driving integrated circuit 140, and even when an external force is applied to the display device 100, the driving integrated circuit 140 110 can be prevented from being detached from the display panel 110.

Further, as shown in FIGS. 3 and 4, the first bonding layers 310 and 410 and the color-changing layer 170 may be disposed to expose the upper surface of the driving integrated circuit 140.

An antistatic member 180 may be disposed on the upper surface of the driving integrated circuit 140.

Specifically, the antistatic member 180 may overlap with all of the upper surface of the driving integrated circuit 140, all of the upper surface of the color-changing layer 170, a portion of the upper surface of the flexible printed circuit 145, and a portion of the upper surface of the stiffener 150.

A surface shape of the antistatic member 180 in a region overlapping with the color-changing layer 170 may be determined according to a surface shape of the color-changing layer 170, which is disposed beneath the antistatic member 180.

That is, in a situation where a portion in which the color-changing layer 170 is formed and a portion in which the color-changing layer 170 is not formed are coexist in a region between the stiffener 150 and the driving integrated circuit 140 and a region between the flexible printed circuit 145 and the driving integrated circuit 140, a portion having a large step difference may exist, and this affects on the surface shape of the antistatic member 180. As a result, defects in the surface of the antistatic member 180 may occur.

Therefore, an amount of a material included in the color-changing layer 170 and a location at which the color-changing layer 170 is disposed are important in order to prevent the defects in the surface of the antistatic member 180.

As described above, in the embodiments herein, as the color-changing layer 170 is disposed up to a portion of the upper surface of the stiffener 150 and a portion of the upper surface of the flexible printed circuit 145, it is possible to prevent the defects in the surface of the antistatic member 180.

As described above, a height and a location of the color-changing layer 170 affects on the reliability of the driving integrated circuit 140 and the aesthetics of the display device 100.

Accordingly, it is necessary to check whether a material of the color-changing layer 170 used to form the color-changing layer 170 is disposed on the display panel 110 in an appropriate amount, and even after the color-changing layer 170 is formed, it is necessary to check whether the color-changing layer 170 is formed at an appropriate location.

When the color-changing layer 170 is formed of transparent resin, it is difficult to check a region where a material of the color-changing layer 170 is disposed, and even after the color-changing layer 170 is formed, it is difficult to determine a location of the color-changing layer 170. Thus, even if a defect caused by the color-changing layer 170 occurs, there is a problem that it is difficult to determine such a defect.

However, since the color-changing layer 170 according to the embodiments herein exhibits a color, even when a process for forming the color-changing layer 170 is performed and even after the disposing of the color-changing layer 170 is completed, it is possible to improve visibility on a location and a height of the color-changing layer.

Hereinafter, embodiments of the present disclosure related to these issues will be specifically reviewed with reference to FIGS. 5 to 7.

Figure 5:
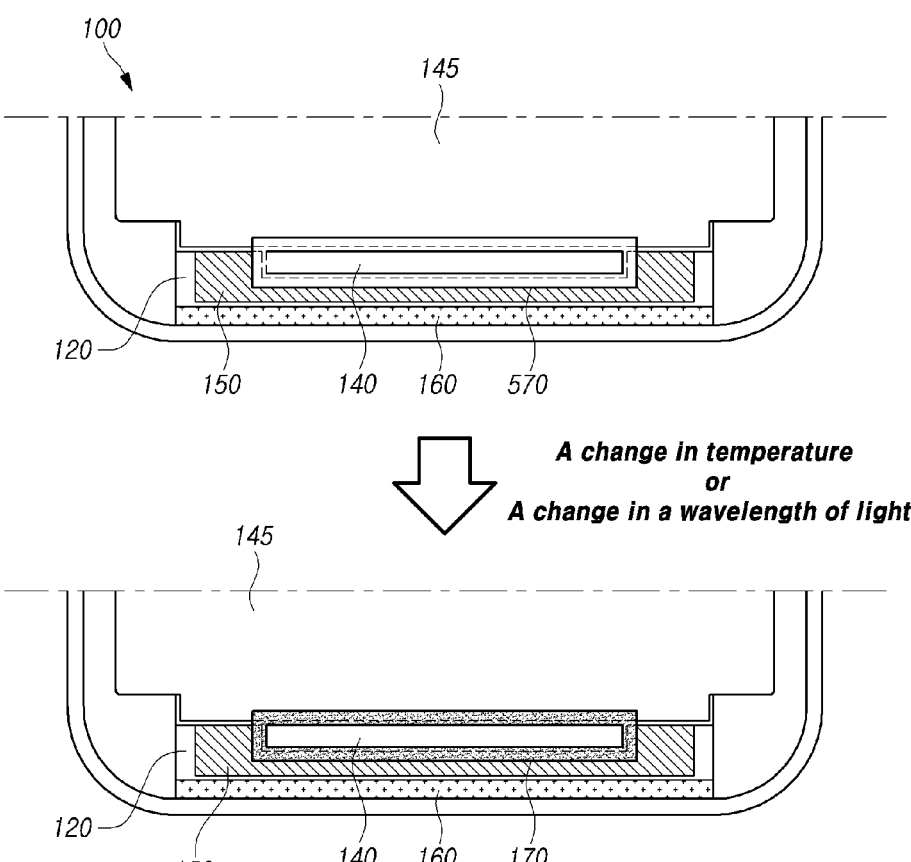
FIG. 5 schematically illustrates a process of disposing a color-changing layer according to aspects of the present disclosure.

FIG. 5 schematically illustrates a process of disposing a color-changing layer according to aspects of the present disclosure. FIG. 6 illustrates characteristics of a color-changing layer according to one embodiment of the present disclosure. FIG. 7 illustrates characteristics of a color-changing layer according to another embodiment of the present disclosure.

Referring to FIG. 5, a color-changing layer material 570 may be applied to a partial area of a lower substrate 120 of a display panel on which a driving integrated circuit 140, a flexible printed circuit 145, and a stiffener 150 are disposed.

The color-changing layer 170 finally disposed on the display device 100 according to aspects of the present disclosure may represent a color. The color of the color-changing layer 170 may be a color different from the material 570 used to form the color-changing layer 170.

In order to form the color-changing layer 170, a matrix curing according to a temperature change applied to the applied color-changing layer material 570 and a pigment changing to a specific color according to such a temperature change may be included in the display panel 110.

Here, the matrix may be formed of any one of polypropylene (PP), polyethylene (PE), polystyrene (PS), and acrylonitrile butadiene styrene (ABS), but embodiments of the present disclosure are not limited thereto. For example, the matrix may be formed of any materials capable of dispersing the pigment. Further, the pigment may be a powder type. However, embodiments of the present disclosure are not limited thereto. For example, the pigment may be a liquid type.

The color-changing layer material 570 may have a white color or any color, and then, change to a different color when it reaches a predetermined temperature, and thereafter, may not return to its original color.

Specifically, the color-changing layer material 570 may have a white color or any color. Thereafter, when a temperature different from a temperature at which the color-changing layer material 570 has been applied is applied, the color-changing layer material 570 may cure, and at the same time, a color of the color-changing layer material 570 may change to another color. As a result, the color-changing layer 170 may have a color different from the color-changing layer material 570.

The color-changing layer material 570 according to the embodiments herein may have a range in which its color changes according to temperatures.

Figure 6:
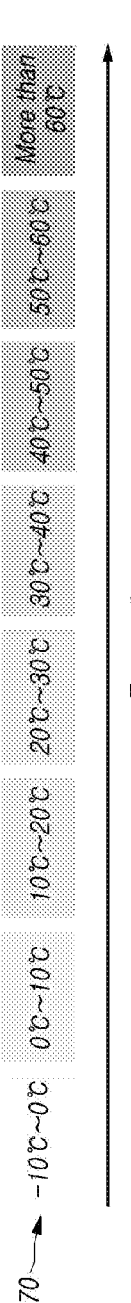
FIG. 6 illustrates characteristics of a color-changing layer according to one embodiment of the present disclosure.

For example, as shown in FIG. 6, the color-changing layer material 570 may represent a first color in the range of −10° C. to 0° C. (more than, or equal to, −10° C. and less than 0° C.), a second color in the range of 0° C. to 10° C., a third color in the range of 10° C. to 20° C., a fourth color in the range of 20° C. to 30° C., a fifth color in the range of 30° C. to 40° C., a sixth color in the range of 40° C. to 50° C., a seventh color in the range of 50° C. to 60° C., and an eighth color at a temperature of 60° C. or higher.

The colors according to the above-described temperature ranges are merely examples. Therefore, colors of the color-changing layer material 570 according to embodiments herein may be changed according to various temperature ranges. For example, a color of the color-changing layer material 570 may be changed according to a width of a temperature range of less than 10° C., or a width of a temperature range of 10° C. or more. Further, as a temperature applied to the color-changing layer material 570 increases or decreases, a width of a temperature range in which a color of the color-changing layer material 570 changes may be increased or decreased.

Further, as illustrated in FIG. 6, as a temperature applied to the color-changing layer material 570 increases, a color of the color-changing layer 170 finally formed may become darker.

In other words, in the first to eighth colors of the color-changing layer material 570, the eighth color may be the darkest color, and the first color may be the lightest color.

However, the colors shown in FIG. 6 (for example, red-based colors) are merely examples, and colors of the color-changing layer material 570 according to embodiments herein may have various colors, such as, yellow-based colors, and green-based colors, black-based colors, or the like.

In a situation where a temperature is applied to the color-changing layer material 570, when the color-changing layer material 570 includes a matrix material that can cure, the application of heat is needed to form the color-changing layer 170. In this process, the color-changing layer material 570 may have a color in a temperature corresponding to a temperature in the process. When heat is applied to cure the color-changing layer material 570, as a color of the color-changing layer material 570 may change, therefore, the color-changing layer 170 finally formed may have a color darker than the color of the color-changing layer material 570.

In this instance, a range of temperature applied when the color-changing layer 170 is formed can be predicted through a color of the color-changing layer 170 formed by using the color change layer material 570.

Therefore, it may be easy to check the quality of the display device 100 according to a degree of curing of the color-changing layer 170.

Specifically, in a situation where a degree of curing of the color-changing layer 170 is severe, and a property that is easy to be broken (brittle property) is produced, and thereby, ability to absorb shock is poor, a probability that the driving integrated circuit 140 may be also damaged by an external force applied from the outside may increases. Further, when a degree of curing of the color-changing layer 170 is weak, the color change layer material 570 may not properly cure and may flow. In this situation, the color-changing layer material 570 may penetrate to the upper surface of the driving integrated circuit 140.

That is, it can be seen that the degree of curing of the color-changing layer material 570 acts as a very important factor in terms of the quality of the display device 100. The color-changing layer 170 according to embodiments herein may represent different colors depending on a curing temperature, and in particular, a status of the color-changing layer 170 or the display device when a degree of curing is weak or severe can be immediately determined based on a color of the color-changing layer 170. Therefore, there is provided an advantage of easily perceiving the quality of the color-changing layer 170. Further, since this can be directly perceived by an inspector's eyes, separate measurement equipment is not required.

Further, since an appropriate curing temperature of the color-changing layer material 570 can be easily determined, there is produced an effect that an associated process setting becomes very simple.

Further, since the color-changing layer 170 finally formed has a color, there is provided an advantage of easily measuring a thickness and a width of the color-changing layer 170. Through this, in a situation where the color-changing layer 170 is over-formed and disposed on the upper surface of the driving integrated circuit 140, or the color-changing layer 170 is formed in a narrow area and thus formed so that the driving integrated circuit 140 cannot be properly fixed, it is possible to easily identify such a status with only an inspector's inspection without a separate inspection device.

Meanwhile, the color-changing layer material 570 according to embodiments herein may include at least two types of pigments different from each other. For example, the color-changing layer material 570 may include a first pigment whose color changes in a first temperature range, and a second pigment whose color changes in a second temperature range different from the first temperature range.

Here, the first pigment may be a pigment whose color changes in a temperature range at which the color-changing layer material 570 cures, and the second pigment may be a pigment whose color changes by heat generated from the driving integrated circuit 140.

For example, when it is assumed that the color-changing layer material 570 cures in the range of 40° C. to 50° C., and the driving integrated circuit 140 starts to be damaged at a temperature of 60° C. or higher, when the color-changing layer material 570 cures, due to the first pigment, the color-changing layer 170 finally formed may have a color resulting from the color changing of the first pigment. In addition, when heat generated from the driving integrated circuit 140 is 60° C. or higher, a color of the color-changing layer material 170 may change due to the second pigment.

Therefore, when a color-changing layer material 570 used to form the color-changing layer 170 includes two or more different pigments, it is possible to identify a process temperature when the color-changing layer 170 is formed, and a situation or time where excessive heat is generated from the driving integrated circuit 140.

Meanwhile, the color-changing layer 170 of the display device 100 according to aspects of the present disclosure is not limited thereto. For example, the display device 100 may include a matrix curing according to a wavelength of light applied on the display panel 110 to form the color-changing layer 170 and a pigment whose color changes to a specific color according to a wavelength of light.

In this instance, a color of the color-changing layer material 570 may be changed according to a wavelength range of light applied to the color-changing layer material 570.

Figure 7:
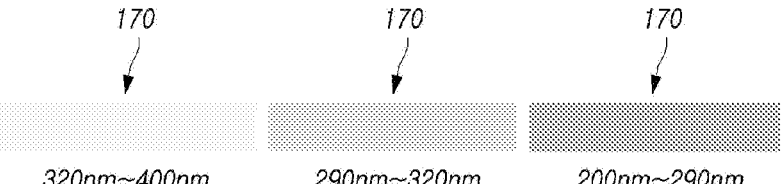
FIG. 7 illustrates characteristics of a color-changing layer according to another embodiment of the present disclosure.

For example, as shown in FIG. 7, a color of the color-changing layer material 570 may be changed depending an ultraviolet ray, which is used for curing the color-changing layer material 570, among ultraviolet rays of 320 nm to 400 nm wavelength (UVA, hereinafter, a first ultraviolet ray), ultraviolet rays of 290 nm to 320 nm wavelength (UVB, hereinafter, a second ultraviolet ray), and ultraviolet rays of 200 nm to 290 nm wavelength (UVC, hereinafter, a third ultraviolet ray).

When it is assumed that a color of the color-changing layer material 570 is a first color, when the color-changing layer material 570 cures with the first ultraviolet ray to form the color-changing layer 170, the color-changing layer 170 may change to a second color different from the first color.

Further, when the color-changing layer material 570 cures with the second ultraviolet ray to form the color-changing layer 170, the color-changing layer 170 may change to a third color different from the first and second colors.

Further, when the color-changing layer material 570 cures with the third ultraviolet ray to form the color-changing layer 170, the color-changing layer 170 may change to a fourth color different from the first to third colors.

Meanwhile, in FIG. 7, the second to fourth colors of the color-changing layer 170 are represented as yellow, green, and blue colors, respectively. However, the second to fourth colors of the color-changing layer 170 are not limited thereto. That is, any colors are available as long as the 2nd to 4th colors are different from one another. Further, the second to fourth colors may be different from the first color, which is the color of the color-changing layer material 570.

Thus, the color-changing layer 170 according to embodiments herein may represent different colors depending on wavelength of light for curing, and in particular, a status of the color-changing layer 170 or the display device when a degree of curing is weak or severe can be immediately determined based on a color of the color-changing layer 170. Therefore, there is provided an advantage of easily perceiving the quality of the color-changing layer 170.

Further, since it is possible to easily determine a wavelength range of light required for appropriate curing of the color-changing layer material 570 (for example, a wavelength range of light for forming the color-changing layer 170 with appropriate height and thickness), there is produced an effect of allowing a corresponding process setting to become very simple.

However, the configuration of the color-changing layer 170 according to the embodiments herein is not limited thereto. The color-changing layer 170 may include all of a pigment whose color changes according to a temperature change (hereinafter, referred to as a first pigment), and a pigment whose color changes according to a wavelength change of light (hereinafter, referred to as a second pigment).

For example, in the process of forming the color-changing layer 170, when any one of the first to third ultraviolet rays is irradiated to the color change layer material 570, the color-changing layer material 570 cures, and as a result, the color-changing layer 170 with a corresponding color may be formed due to the second pigment. In this instance, the color of the color-changing layer 170 may be determined according to a wavelength of light irradiated during such a process. Further, when high temperature heat is generated from the driving integrated circuit 140 while the display device 100 is driven, the color of the color-changing layer 170 may be changed again due to the first pigment included in the color-changing layer 170.

Therefore, it is possible to obtain a process temperature when the color-changing layer 170 is formed through the second pigment included in the color-changing layer 170, and identify the generation of excessive heat in the driving integrated circuit 140 through the first pigment included in the color-changing layer 170.

Next, referring to FIG. 8, a stack structure of the display device according to aspects of the present disclosure will be reviewed as follows.

Figure 8:
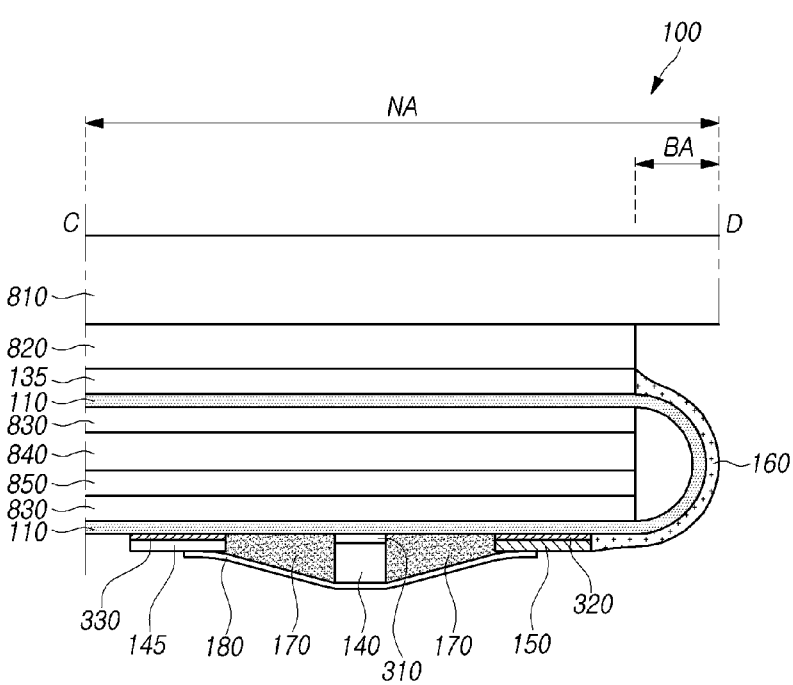
FIG. 8 is a cross-sectional view taken along with line C-D of FIG. 2 according to one embodiment.

FIG. 8 is a cross-sectional view taken along with line C-D of FIG. 2 according to one embodiment.

Referring to FIG. 8, the display device 100 includes the display panel 110 including the lower substrate 120 and the upper substrate 130, the polarizing plate 135 disposed on the display panel 110, and the driving integrated circuit 140 disposed in the non-active area NA of the panel 110, the flexible printed circuit 145, the stiffener 150, the coating layer 160, the color-changing layer 170, and the antistatic member 180.

In the display device 100 according to embodiments herein with reference to FIG. 8, the display panel 110 including the lower substrate 120 and the upper substrate 130, the polarizing plate 135 disposed on the display panel 110, the driving integrated circuit 140 disposed in the non-active area NA of the display panel 110, the flexible printed circuit 145, the stiffener 150, the coating layer 160, the color-changing layer 170, and the antistatic member 180 may be equal to the display panel 110 including the lower substrate 120 and the upper substrate 130, the polarizing plate 135 disposed on the display panel 110, the driving integrated circuit 140 disposed in the non-active area NA of the display panel 110, the flexible printed circuit 145, the stiffener 150, the coating layer 160, the color-changing layer 170, and the antistatic member 180, which are described with reference to FIGS. 1 to 4, respectively.

Referring to FIG. 8, the display panel 110 of the display device 8 may be bent in a bending direction in the bending area BA.

In the bending area BA, the coating layer 160 is disposed on the upper surface of the display panel 110 so that various lines disposed in the bending area BA can be located to be close to a neutral surface.

Meanwhile, in FIG. 8, when the display device 100 is bent, the driving integrated circuit 140 and the flexible printed circuit 143 are shown to correspond to the non-active area NA of the display device 100. However, embodiments of the present disclosure are not limited thereto. A portion of the flexible printed circuit 143 may overlap at least a portion of the active area of the display device 100, and in some instances, the flexible printed circuit 143 and the driving integrated circuit 140 may overlap at least a part of the active area.

Referring to FIG. 8, the polarizing plate 135 may be disposed on an upper surface of the display panel 110.

A first bonding member 820 may be disposed on the polarizing plate 135, and a cover glass 810 may be disposed on the first bonding member 820.

Further, the stiffener 150, the driving integrated circuit 140, the flexible printed circuit 145, the color-changing layer 170, and the antistatic member 180 may be disposed on the upper surface of the display panel 110. As shown in FIG. 8, when the display panel 110 is bent in the bending area BA, the stiffener 150, the driving integrated circuit 140, the flexible printed circuit 145, the color-changing layer 170, and the antistatic member 180 may be disposed on a rear surface of a displaying surface of the display panel 110.

The color-changing layer 170 may include a matrix and a pigment, and have a color.

Further, back films 830 spaced apart from each other are disposed on the rear surface of the display panel 110. The back films 830 may be disposed to be spaced apart from each other, and the bending area BA may be located between the back films 830.

First and second support members 840 and 850 for supporting the display panel 110 may be disposed between the back films 830. The first and second support members 840 and 850 may include at least one type of metal material (e.g., chromium); however, embodiments of the present disclosure are not limited thereto. For example, any other materials are available for the first and second support members 840 and 850 as long as such materials are capable of supporting the display panel 110.

In the display device 100 according to embodiments herein, as the driving integrated circuit 140 is bonded on or over the lower substrate 120 of the display panel 110 without a separate substrate or film, it is therefore possible to reduce a size of a region where the driving integrated circuit 140 is placed.

Further, by including the color-changing layer 170 surrounding all or at least a portion of one or more lateral surfaces of the driving integrated circuit 140, it is possible to prevent the driving integrated circuit 140 bonded on the lower substrate 120 from being deformed by an external force, or prevent foreign substances such as moisture from penetrating into the driving integrated circuit 140.

Further, since a process condition of the color-changing layer 170 may be obtained through a color of the color-changing layer 170 having a color, when defects occur in the color-changing layer 170, it is possible to quickly correct incorrect process conditions. Further, since the color-changing layer 170 has a color, and a position and a thickness of the color-changing layer 170 can be checked with the eyes of an inspector, therefore, the quality of the color-changing layer 170 can be checked without a separate measuring device.

Further, in a situation where the color-changing layer 170 includes two or more different pigments (their colors are changed depending on temperature ranges or specific temperatures), when the color-changing layer 170 is formed, a corresponding process temperature can be obtained, and at the same time, the generation of excessive heat from the driving integrated circuit 140 can be also identified.

Further, by including the stiffener 150 disposed to be spaced apart from the driving integrated circuit 140 and disposed to surround all, or at least a portion, of one or more lateral surfaces of the driving integrated circuit 140, it is possible to prevent the driving integrated circuit 140 bonded on the lower substrate 120 from being deformed by an external force or from being detached from the lower substrate 120.

The above description has been presented to enable any person skilled in the art to make and use the invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. Although the exemplary embodiments have been described for illustrative purposes, a person skilled in the art will appreciate that various modifications and applications are possible without departing from the essential characteristics of the present disclosure. For example, the specific components of the exemplary embodiments may be variously modified. The above description and the accompanying drawings provide an example of the technical idea of the present invention for illustrative purposes only. That is, the disclosed embodiments are intended to illustrate the scope of the technical idea of the present disclosure. Thus, the scope of the present disclosure is not limited to the embodiments shown, but is to be accorded the widest scope consistent with the claims. The scope of protection of the present disclosure is to be construed according to the claims, and all technical ideas within the scope of the claims should be interpreted as being included in the scope of the present invention.

What is claimed is:

1. A display apparatus comprising:
a display panel including an active area and a non-active area surrounding the active area;
a driving integrated circuit in the non-active area;
a polarizing plate extending from the active area to a part of the non-active area;
a coating layer on the non-active area, the coating layer between the polarizing plate and the driving integrated circuit; and
a stiffener spaced apart from the coating layer, the stiffener surrounding at least a portion of a side surface of the driving integrated circuit,
wherein the stiffener and the driving integrated circuit are disposed on an upper surface of the display panel, and the stiffener is spaced apart from the driving integrated circuit.

2. The display apparatus of claim 1, further comprising:
an antistatic member on at least part of the stiffener and an upper surface of the driving integrated circuit.

3. The display apparatus of claim 2, wherein an area of the antistatic member is greater than an area of the driving integrated circuit.

4. The display apparatus of claim 2, wherein the antistatic member is on a color-changing layer, and on at least a portion of an upper surface of a flexible printed circuit.

5. The display apparatus of claim 4, wherein the antistatic member is electrically connected to a ground formed in the flexible printed circuit.

6. The display apparatus of claim 4, wherein the antistatic member includes an extension part on one side of the antistatic member.

7. The display apparatus of claim 6, wherein the extension part on the flexible printed circuit.

8. The display apparatus of claim 6, wherein the extension part is electrically connected the flexible printed circuit.

9. The display apparatus of claim 1, wherein a thickness of the coating layer is decreases from a direction in which the polarizing plate is disposed to a direction in which the driving integrated circuit is disposed.

10. The display apparatus of claim 1, further comprising:
a color-changing layer surrounding at least a portion of a side surface of the driving integrated circuit.

11. The display apparatus of claim 10, wherein the color-changing layer overlaps a portion of an upper surface of the stiffener.

12. The display apparatus of claim 10, wherein the color-changing layer includes at least one of a first pigment having a color that changes according to a change in temperature and a second pigment having a color that changes according to a wavelength change of light.

13. The display apparatus of claim 12, wherein the first pigment and the second pigment are different types of pigments whose respective color changes in respective temperature ranges that are different from each other.

14. The display apparatus of claim 12, wherein the first pigment and the second pigment do not return to original respective colors after the original respective colors are changed according to the change in temperature or the wavelength change of light.

15. The display apparatus of claim 1, further comprising:
a flexible printed circuit in a portion or a side of a pad area of the display panel, the flexible printed circuit spaced apart from the driving integrated circuit.

16. The display apparatus of claim 15, wherein a portion of a color-changing layer extends from a region corresponding to a lateral surface of the driving integrated circuit up to a portion of an upper surface of the flexible printed circuit.

17. The display apparatus of claim 16, wherein the color-changing layer exposes at least a portion of an upper surface of the driving integrated circuit.

18. The display apparatus of claim 1, wherein the non-active area of the display panel includes a bending area and the coating layer disposed in the bending area.

19. The display apparatus of claim 1, further comprising:
a bonding layer between the driving integrated circuit and the display panel.

20. The display apparatus of claim 19, wherein the bonding layer contacts at least a portion of a lateral surface or a lower surface of the driving integrated circuit.

* * * * *